(12) United States Patent
Bulzacchelli et al.

(10) Patent No.: US 9,793,913 B2
(45) Date of Patent: Oct. 17, 2017

(54) SINGLE-FLUX-QUANTUM PROBABILISTIC DIGITIZER

(71) Applicant: International Business Machines Corporation, Armonk, NY (US)

(72) Inventors: John F. Bulzacchelli, Yonkers, NY (US); Mark B. Ketchen, Hadley, MA (US); Christopher B. Lirakis, Cortlandt Manor, NY (US); Alexey Y. Lvov, Congers, NY (US); Stanislav Polonsky, Moscow (RU); Mark B. Ritter, Sherman, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/437,043

(22) Filed: Feb. 20, 2017

(65) Prior Publication Data

US 2017/0179973 A1    Jun. 22, 2017

Related U.S. Application Data

(63) Continuation of application No. 14/972,303, filed on Dec. 17, 2015, now Pat. No. 9,614,532.

(51) Int. Cl.
| | |
|---|---|
| *H03M 1/12* | (2006.01) |
| *H03M 1/08* | (2006.01) |
| *H03M 1/10* | (2006.01) |
| *G11C 27/02* | (2006.01) |
| *H03K 5/24* | (2006.01) |

(52) U.S. Cl.
CPC ........... *H03M 1/1245* (2013.01); *G11C 27/02* (2013.01); *H03K 5/24* (2013.01); *H03M 1/08* (2013.01); *H03M 1/1009* (2013.01); *H03M 1/1071* (2013.01)

(58) Field of Classification Search
USPC ....................................................... 341/133
See application file for complete search history.

(56) References Cited

U.S. PATENT DOCUMENTS

| | | | |
|---|---|---|---|
| 4,401,900 | A | 8/1983 | Faris |
| 4,458,160 | A | 7/1984 | Josephs et al. |
| 4,533,840 | A | 8/1985 | Gheewala et al. |
| 4,902,908 | A | 2/1990 | Harada |
| 5,191,236 | A | 3/1993 | Ruby |

(Continued)

FOREIGN PATENT DOCUMENTS

| | | |
|---|---|---|
| CN | 101553723 A | 10/2009 |
| JP | 05268091 A | 10/1993 |

(Continued)

OTHER PUBLICATIONS

U.S. Appl. No. 15/437,043, filed Feb. 20, 2017.

(Continued)

*Primary Examiner* — Howard Williams
(74) *Attorney, Agent, or Firm* — David B. Woycechowsky

(57) ABSTRACT

A probabilistic digitizer for extracting information from a Josephson comparator is disclosed. The digitizer uses statistical methods to aggregate over a set of comparator readouts, effectively increasing the sensitivity of the comparator even when an input signal falls within the comparator's gray zone. Among other uses, such a digitizer may be used to discriminate between states of a qubit.

18 Claims, 9 Drawing Sheets

(56) References Cited

U.S. PATENT DOCUMENTS

| | | | |
|---|---|---|---|
| 5,266,844 | A | 11/1993 | Ko et al. |
| 6,331,805 | B1 | 12/2001 | Gupta et al. |
| 6,608,518 | B2 | 8/2003 | Furuta et al. |
| 6,812,880 | B2 | 11/2004 | Paulus |
| 8,674,868 | B2 | 3/2014 | Vigoda et al. |
| 8,736,479 | B2 | 5/2014 | Keane |
| 9,355,364 | B2 | 5/2016 | Miller et al. |
| 2003/0028338 | A1* | 2/2003 | Hidaka ............... G01R 15/148 702/79 |
| 2006/0097746 | A1 | 5/2006 | Amin |
| 2008/0129368 | A1 | 6/2008 | Furuta et al. |
| 2009/0121749 | A1 | 5/2009 | Roberts et al. |
| 2010/0026538 | A1 | 2/2010 | Herr et al. |
| 2012/0274494 | A1 | 11/2012 | Kirichenko |
| 2015/0358022 | A1 | 12/2015 | McDermott, III et al. |
| 2016/0164505 | A1 | 6/2016 | Naaman et al. |
| 2016/0329896 | A1 | 11/2016 | Bronn |

FOREIGN PATENT DOCUMENTS

| | | | |
|---|---|---|---|
| JP | 2002223163 | A | 8/2002 |
| JP | 4166185 | B2 | 10/2008 |

OTHER PUBLICATIONS

U.S. Appl. No. 14/972,303, filed Dec. 17, 2015.
List of IBM Patents or Patent Applications Treated as Related, Filed Feb. 21, 2017, 2 pages.
Bradley et al., "A Comparison of Two Types of Single Flux Quantum Comparators for a Flash ADC with 10 GHz Input Bandwidth", IEEE Transactions on Applied Superconductivity, vol. 7, No. 2, Jun. 1997, pp. 2677-2680.
Bulzacchelli et al., "Superconducting Bandpass $\Delta\Sigma$ Modulator With 2.23-GHz Center Frequency and 42.6-GHz Sampling Rate", IEEE Journal of Solid-State Circuits, vol. 37, No. 12, Dec. 2002, pp. 1695-1702.
Bulzacchelli et al., "Single-Flux-Quantum Probabilistic Digitizer", U.S. Appl. No. 14/972,303, filed Dec. 17, 2015, 36 pages.
Filippov et al., "Signal Resolution of RSFQ Comparators" IEEE Transactions on Applied Superconductivity, vol. 5, No. 2, Jun. 1995, 4 pages.
Hover et al., "High fidelity qubit readout with the superconducting low-inductance undulatory galvanometer microwave amplifier", Applied Physics Letters 104, 152601 (2014), 4 pages.
Mukhanov et al., "Superconductor Analog-to-Digital Converters", Proceedings of the IEEE, vol. 92, No. 10, Oct. 2004, pp. 1564-1584.
Nakamura et al., "Current Resolution of a Single-Flux-Quantum Readout Circuit Based on Current-to-Time Conversion Toward a Flux Qubit System", IEEE Transactions on Applied Superonductivity, vol. 19, No. 3, Jun. 2009, pp. 973-976.
Wallraff et al. "Approaching Unit Visibility for Control of a Superconducting Qubit with Dispersive Readout", PRL 95, 060501 (2005), week ending Aug. 5, 2005, Physical Review Letters, 4 pages.
International Search Report and Written Opinion, International Application No. PCT/IB2016/055357, International Filing Date Sep. 8, 2016.
"Quantum computing"—Wikipedia, the free encyclopedia, Feb. 26, 2015, <https://enwikipedia.org/w/index.php?title=Quantum_computing&oldid=648975352>, 12 pages.

\* cited by examiner

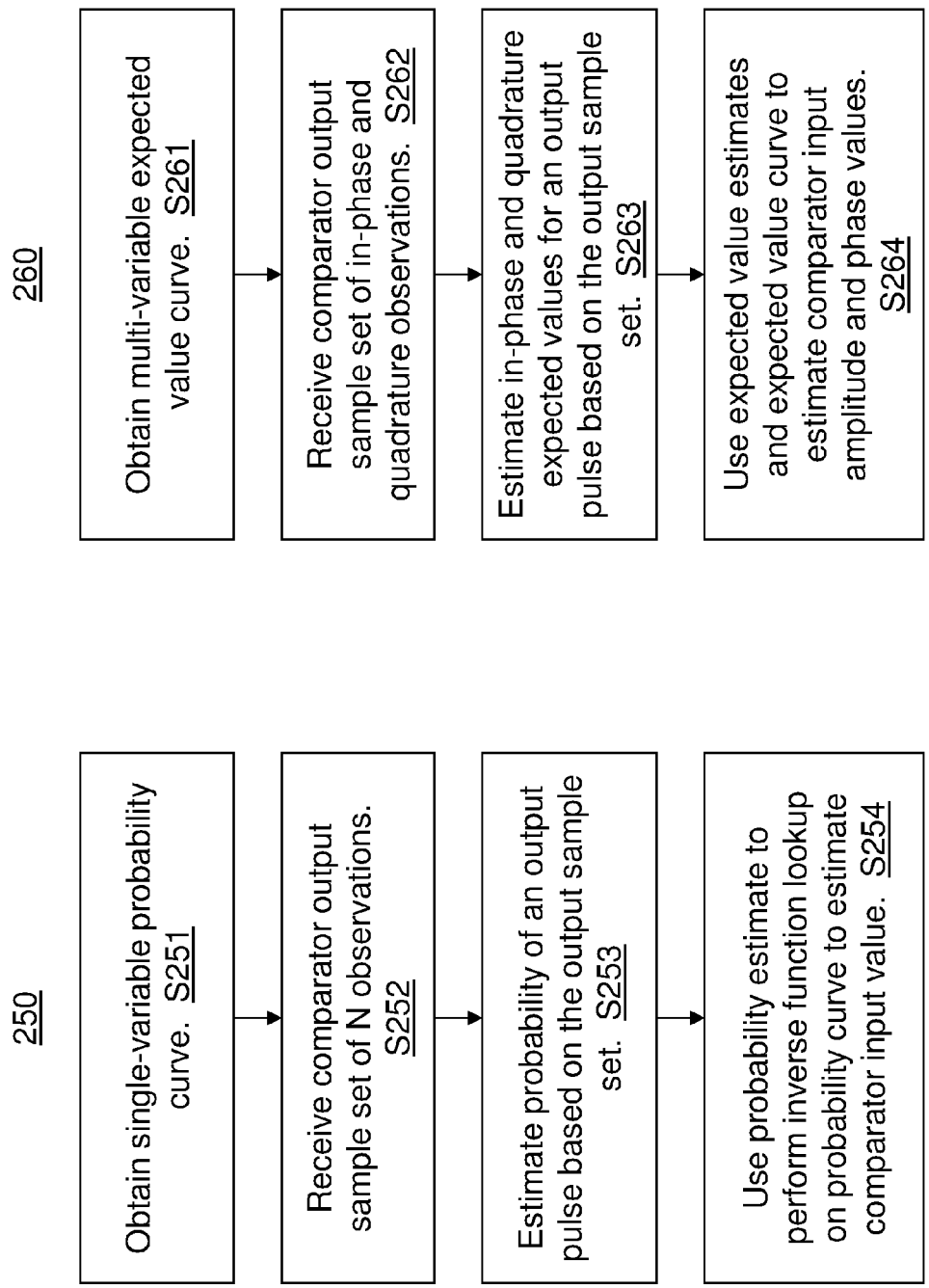

SINGLE-FLUX-QUANTUM PROBABILISTIC DIGITIZER

STATEMENT REGARDING FEDERALLY SPONSORED WORK

This invention was made with United States Government support under contract number H98230-13-C-0220 entered with the following United States Governmental Agency: Department of Defense. The United States government has certain rights to this invention.

BACKGROUND OF THE INVENTION

The present invention relates generally to the field of digital detection, and more particularly to single-flux-quantum (SFQ) digital detection devices.

Josephson junctions are known. A Josephson junction is made up of two superconductors coupled by a weak link. Several types of weak links are known, including insulators, non-superconducting metals, and physical constrictions. Josephson junctions have been used to construct Josephson comparators. In at least some Josephson comparators, a pair of Josephson junctions, operating on quantum mechanical principles, act together as a decision-making pair to signal whether or not an input current is above or below a threshold level whenever a clock pulse is applied. This threshold level is known to be subject to physical noise, which blurs the threshold level such that in practice it is actually a range, known as the "gray zone" of the comparator. Typical Josephson comparators have a noise-limited sensitivity, or difference required between signal levels for accurate detection, on the order of a few microamps. Properties of Josephson comparators can include extremely high speed operation, low power consumption, low noise, and high sensitivity, and as a result these comparators have found use in devices such as single-flux-quantum (SFQ) analog-to-digital converters (ADCs) and other applications where the value of such properties justifies the costs of their production and operation. Among the uses proposed for Josephson junctions has been as readout support for qubits in a quantum computing device.

SUMMARY

According to an aspect of the present invention, there is a method for extracting information from a Josephson comparator that performs the following steps (not necessarily in the following order): (i) obtaining a set of predetermined probabilities of observing an output pulse from the Josephson comparator, each probability corresponding to a valid set of discrete parameter values of an input signal to the Josephson comparator; (ii) collecting a set of outputs produced by the Josephson comparator in response to sampling the input signal; (iii) computing one or more threshold values for counts of output pulses from the Josephson comparator with respect to the size of the set of outputs; (iv) determining an empirical count of output pulses; and (v) hypothesizing the discrete parameter values of the input signal by comparing the empirical count of output pulses against the one or more threshold values. At least a subset of outputs in the set of outputs are produced by a set of one or more input signal parameter values that lie within a gray zone of the Josephson comparator.

According to a further aspect of the present invention, there is a method for extracting information from a Josephson comparator that performs the following steps (not necessarily in the following order): (i) collecting a set of outputs produced by the Josephson comparator in response to sampling an input signal; (ii) estimating, based on the set of outputs collected, a probability of the Josephson comparator producing an output pulse in response to sampling an input signal; and (iii) estimating a value of the input signal by calculating the inverse function of the estimated probability using a probability curve that expresses probability as a function of input signal value. At least a subset of outputs in the set of outputs are produced by an input signal value that lies within a gray zone of the Josephson comparator.

According to a further aspect of the present invention, there is a method for extracting information from a Josephson comparator that performs the following steps (not necessarily in the following order): (i) collecting a set of outputs produced by the Josephson comparator in response to sampling an input signal, wherein the set of outputs includes both in-phase and quadrature outputs; (ii) estimating, based on the in-phase outputs of the set of outputs collected, an in-phase expected value of the output of the Josephson comparator; (iii) estimating, based on the quadrature outputs of the set of outputs collected, a quadrature expected value of the output of the Josephson comparator; and (iv) estimating input signal amplitude and input signal phase by solving a set of simultaneous equations that relate amplitude and phase to in-phase and quadrature expected values. At least a subset of outputs in the set of outputs are produced by a set of one or more input signal parameter values that lie within a gray zone of the Josephson comparator.

According to a further aspect of the present invention, there is a method for extracting information from a Josephson comparator that performs the following steps (not necessarily in the following order): (i) collecting a set of outputs produced by the Josephson comparator in response to sampling an input signal; (ii) estimating one or more probabilities of the Josephson comparator producing an output pulse based on the set of outputs collected; and (iii) estimating a value of one or more input signal parameters using the estimated probabilities and a probability curve that expresses probability as a function of the one or more input signal parameters. At least a subset of outputs in the set of outputs are produced by a set of one or more input signal parameter values that lie within a gray zone of the Josephson comparator.

According to a further aspect of the present invention, there is a method for extracting information from a Josephson comparator that performs the following steps (not necessarily in the following order): (i) collecting a set of outputs produced by the Josephson comparator in response to sampling an input signal; (ii) combining the set of outputs into an aggregate measure; and (iii) determining, based on the aggregate measure, a qubit state that produced the collected outputs. At least a subset of outputs in the set of outputs are produced by a set of one or more input signal parameter values that lie within a gray zone of the Josephson comparator.

According to a further aspect of the present invention, there is a method, computer program product and/or computer system for extracting information from a Josephson comparator that performs the following operations (not necessarily in the following order): (i) receiving a plurality of sample sets, with each sample set including N sequential samples; (ii) for each given sample set of the plurality of sample sets: (a) estimating a probability $p(j)$ of an output pulse being produced from a Josephson comparator based on the N sequential samples of the given sample set, and (b) estimating an analog input current $Ix(j)$ corresponding to the given sample set based on an inverse function of p(j) for the given sample set using a probability curve Prob(Ix); and (iii) extracting a signal from output of the Josephson comparator based, at least in part upon the analog input current Ix(j) values respectively corresponding to the sample sets.

BRIEF DESCRIPTION OF THE DRAWINGS

FIG. 8B is a flowchart showing a second embodiment method performed, at least in part, by the fourth embodiment system;

FIG. 8C is a flowchart showing a third embodiment method performed, at least in part, by the fourth embodiment system.

DETAILED DESCRIPTION

Figure 1:
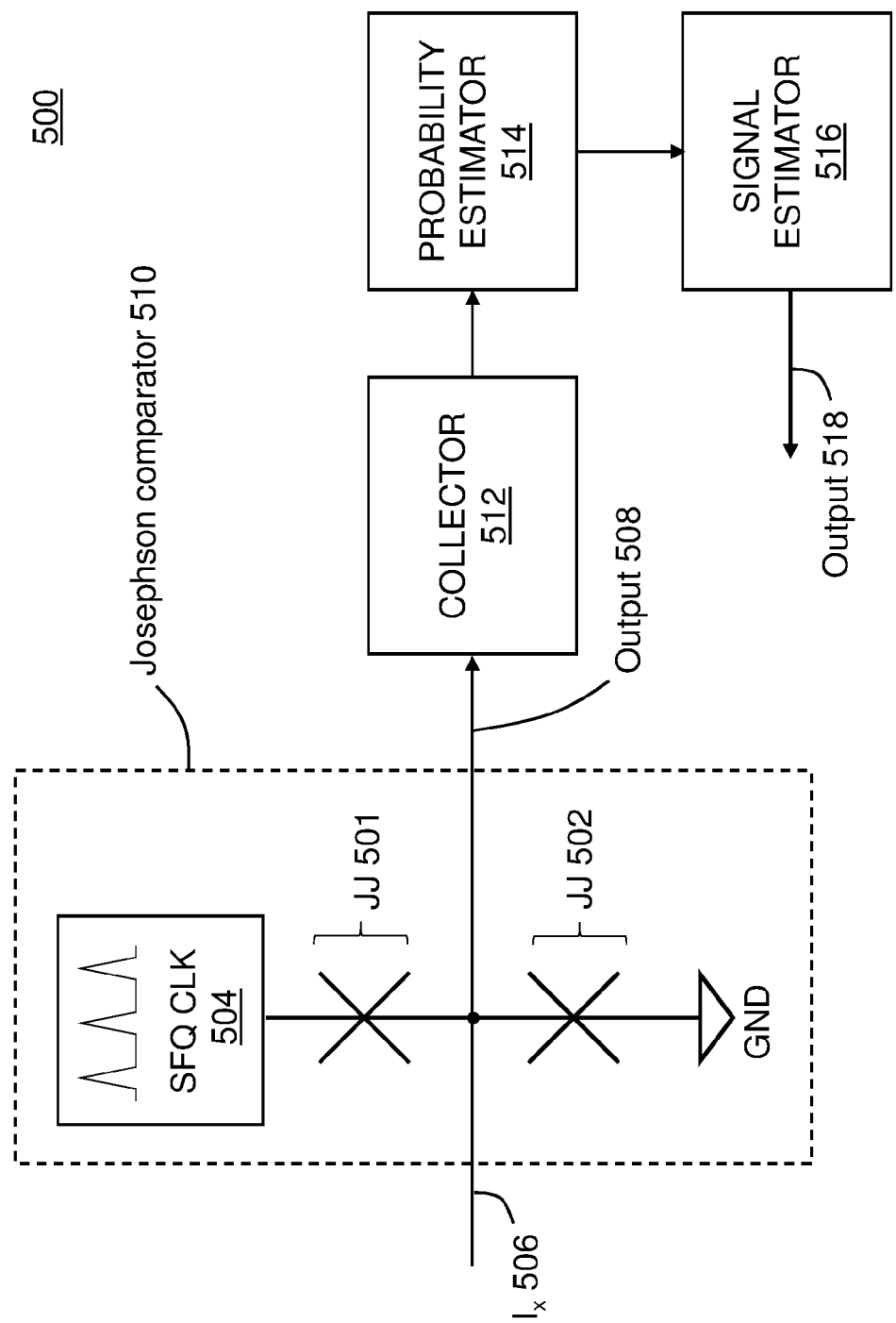
FIG. 1 is a block diagram of a first embodiment system according to the present invention.

Some embodiments of the present invention use statistical analysis to extract information from a set of outputs obtained from a Josephson comparator when input to that comparator is in the comparator's gray zone. This effectively increases the sensitivity of the comparator beyond what can be achieved using conventional techniques. The information thus extracted can then be used for various applications, such as estimating characteristics of an analog input signal or distinguishing between or among two or more discrete input states.

Some embodiments of the present invention recognize: (i) that device noise limits the ultimate sensitivity of a Josephson comparator, with such sensitivities typically falling in the range of several microamps (5-10 µA, for instance); (ii) that Josephson comparators exhibit promise in the field of quantum computing for reading the state of a qubit, such as detecting qubit state by probing the qubit with a very weak radio frequency (RF) pulse; (iii) that for such a quantum computing qubit readout application, the ability to detect signals with amplitudes in the nA range (5-50 nA, for example) is necessary or advantageous; but (iv) that as such amplitude of the RF signal is very small, much smaller than the comparator's noise-limited sensitivity, the signal falls within the gray zone of the Josephson comparator, where the measured output is a probabilistic function of the qubit state.

As a consequence, some embodiments of the present invention recognize: (i) that probabilistic digitization can be used to acquire information about such small signals by repeating a measurement multiple times and applying knowledge of statistics and probability to determine the state; (ii) that a probabilistic digitizer can therefore be used as a readout device for qubits in a quantum computer; and (iii) that, more generally, this approach to solving such a binary detection problem by using sample statistics to determine which of two possible parameter values or states is present can be extended to solve an M-ary detection problem, using sample statistics to determine which of M possible parameter values, value sets, or states is present out of a universe of M valid sets of parameter values (where a set is composed of one or more parameter values for parameters such as amplitude, phase, and/or state). Some embodiments of the present invention recognize that analog input signals to a Josephson comparator can also be estimated by probabilistic methods using a probabilistic digitizer when input levels fall in the comparator's gray zone. Details of applying a probabilistic digitizer to overcome gray zone limitations of Josephson comparators will be described below, with embodiments illustrating their use for estimating a baseband signal, estimating a passband signal, and distinguishing between or among a discrete number of known states (such as for reading out the state of a qubit).

Some embodiments of the present invention recognize that in some conventional qubit systems: (i) the raw qubit readout signal (for example, from a Cooper pair box capacitively coupled to a single mode of the electromagnetic field of a transmission line resonator) is weak; (ii) the weak readout signal is detected with an "RF amp" (which could be any type of RF amplifier); and (iii) a mixer after the RF amplifier may be used as an analog technique for separating out in-phase (I) and quadrature (Q) components of the readout signal. Further, some embodiments of the present invention recognize that in some conventional qubit systems: (i) a Superconducting Low-inductance Undulatory Galvanometer (SLUG) has been used as a type of "quantum limited" amplifier for amplifying a raw qubit readout signal; (ii) the SLUG has limited gain; and (iii) because of this limited gain, the output from the SLUG is delivered to a high-electron-mobility transistor (HEMT) low-noise amplifier. Still further, some embodiments of the present invention provide a probabilistic digitizer with very high sensitivity, such that the HEMT amplifier just discussed is not necessary, because the probabilistic digitizer can sense the SLUG output directly. Some embodiments of the present invention recognize that, if the sensitivity of the probabilistic digitizer is high enough, the raw qubit readout signal may be sensed directly (without a quantum-limited amplifier such as a SLUG).

Some embodiments of the present invention recognize that qubit readout in a quantum computer may be performed by probing the qubit state, applying a weak RF pulse to the qubit and measuring the phase shift of the RF signal that comes back. The applied RF pulse has a frequency different than the fundamental resonant frequency of the qubit so that the qubit state is not disturbed. The resulting amplitude and/or phase shift of the returned RF signal depends on the qubit state. (For example, when primarily detecting a phase shift, a phase-sensitive discriminator can be used to determine whether the qubit state is |0> or |1>.) Since the applied/emitted RF pulse is very weak, quantum-limited amplifiers/HEMTs may be used to assist in the readout process by boosting the amplitude of the received signal above the gray zone of the readout comparator used for detection. As recognized by some embodiments of the present invention, an alternative or complementary approach is to use a probabilistic digitizer to effectively increase the sensitivity of the comparator to discriminate between qubit states even when the amplitude of the emitted RF pulse falls within the comparator's gray zone.

Figure 9:
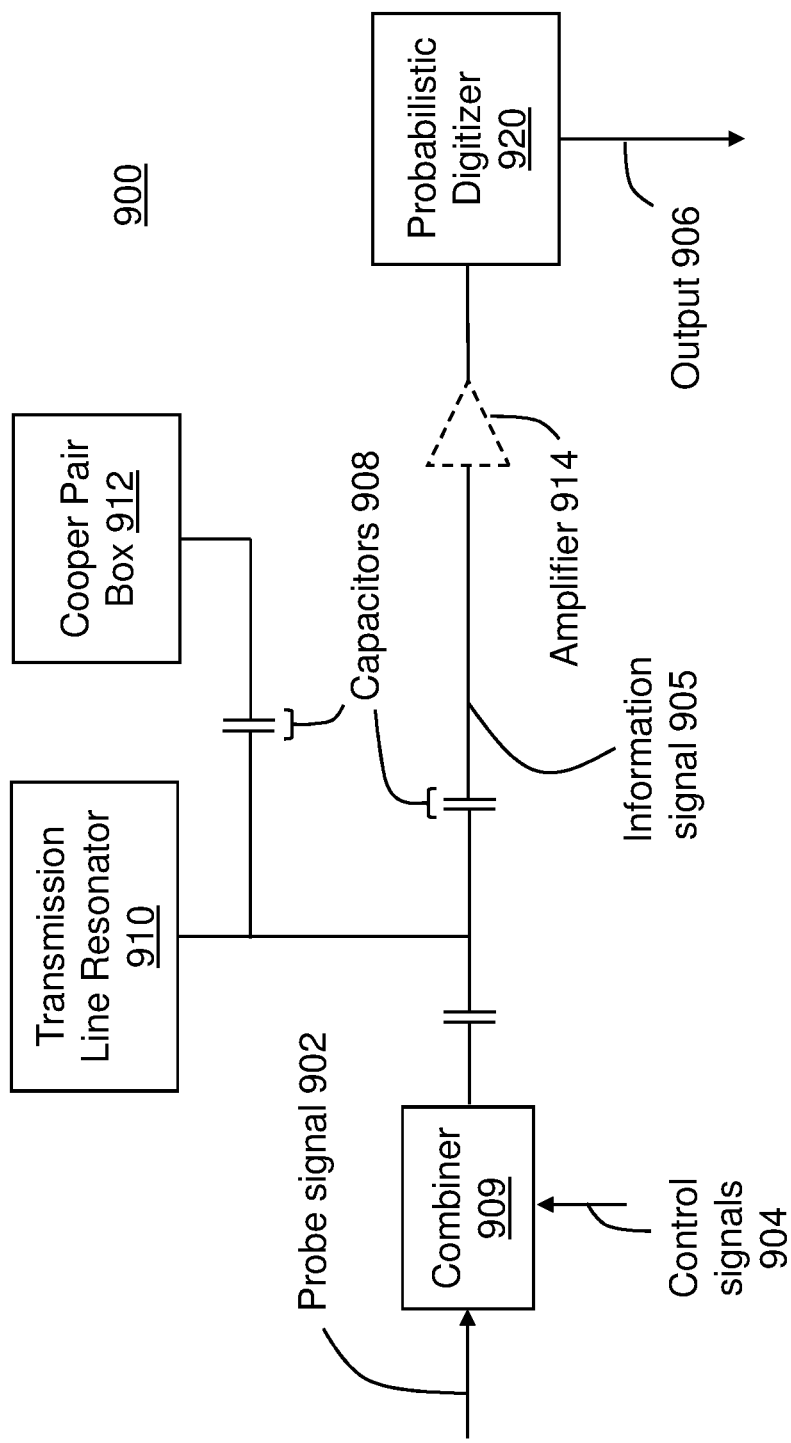
FIG. 9 is a block diagram of a fifth embodiment system according to the present invention.

Shown in FIG. 9 is circuit 900, an embodiment of the present invention that illustrates this latter approach for a phase-sensitive measurement of a microwave input signal 902 (alternatively or in addition, amplitude could be used). Circuit 900 includes: probe signal 902; one or more control signals 904; information signal 905; output signal or readout 906; capacitors 908; combiner 909; transmission line resonator 910; Cooper pair box 912; (optional) amplifier 914; and probabilistic digitizer 920. A qubit is maintained by Cooper pair box 912, and is coupled to the setting and readout circuits via one or more capacitors 908 and transmission line resonator 910. Probe signal 902, which may be pulsed or continuous, enters the circuit as shown, and is added to one or more control signals 904 in combiner 909. Control signals 904 control aspects of the circuit such as Cooper pair box level separation and coherency manipulation. The signal leaving combiner 909 acquires information relating to the state of the qubit stored in Cooper pair box 912, to become information signal 905 from which information is extracted via a set of readouts taken by probabilistic digitizer 920, which combines, or aggregates, individual readout values to produce output 906. Because circuit 900 uses a probabilistic digitizer to effectively increase the sensitivity of the readout circuit(s) to discriminate between qubit states even for very weak RF pulses, amplifier 914 is not necessarily required, and is therefore shown with dashed lines.

As discussed in detail below, a probabilistic digitizer such as probabilistic digitizer 920 can perform quadrature sampling of the information signal in order to detect its in-phase and quadrature components, which in most applications eliminates the need for an analog mixer (and associated local oscillator) as used in conventional (heterodyne) RF detection circuitry. Therefore in FIG. 9 the output of amplifier 914 is directly connected to the input of probabilistic digitizer 920. On the other hand, it is possible to insert a mixer between the output of amplifier 914 and the input of probabilistic digitizer 920, in which case the probabilistic digitizer samples a frequency-translated version of the information signal. Such a modification, which does not depart from the spirit or scope of the invention, may be useful if the center frequency of the information signal falls outside the bandwidth of the probabilistic digitizer.

Some embodiments of the present invention recognize that single-flux-quantum (SFQ) analog-to-digital converters (ADCs), which provide conversion from the analog domain to the digital domain, include Josephson comparator circuits. An example of a simple Josephson comparator circuit, used in some embodiments of the present invention, is balanced Josephson comparator 510 shown in FIG. 1. Comparator 510 includes: Josephson junctions 501 and 502 (together, the decision-making pair); and SFQ clock 504. Analog input current $I_x$ 506 enters the comparator as shown. As SFQ clock pulses (CLK(i) for i=1, 2, . . . ) are applied to serially connected Josephson junctions 501 and 502, an SFQ pulse is generated across junction 502 when the input current is substantially greater than zero ($I_x$>0), producing a digital "1" at comparator output 508 (cmp(i)=1). When the input signal is substantially less than zero ($I_x$<0), application of CLK(i) generates an SFQ pulse across junction 501 rather than junction 502, producing no output pulse at comparator output 508. This is a digital "0" (cmp(i)=0).

However, as recognized by some embodiments of the present invention, there is a range of input signals for which the output from a Josephson comparator circuit is probabilistic. In other words, the threshold for distinguishing between two signal levels is not a point value, but a range: a "0" is detected for an input signal below the threshold range, a "1" is detected for an input signal above the threshold range, and an input signal falling within the threshold range may produce either a "0" or a "1" with a probability defined by the specific properties of the comparator and the actual input signal level.

Figure 2:
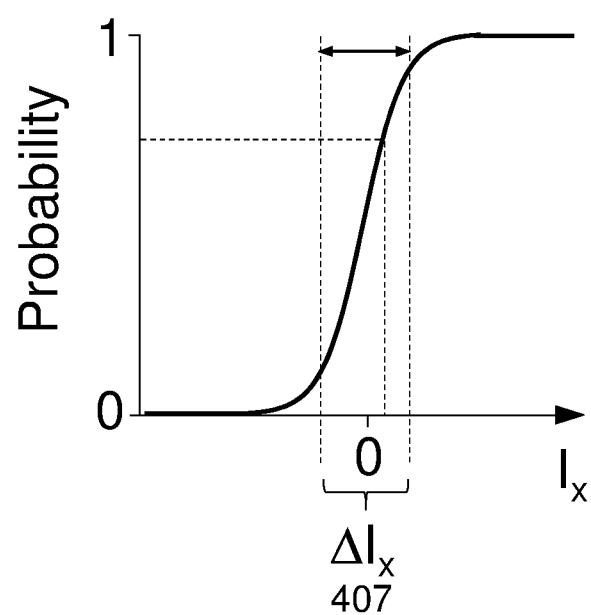
FIG. 2 is a graph showing the probability of detecting a particular output state as a function of input current to a Josephson comparator in the first embodiment system according to the present invention.

This situation is illustrated with respect to comparator 510 by graph 400 of FIG. 2. Graph 400 shows the probability of cmp(i)=1 as a function of input current $I_x$. Because comparator 510 is a balanced comparator, the critical currents of junctions 501 and 502 are equal, so an $I_x$ of 0 places the comparator exactly at its switching point (probability=50%). For values of $I_x$ sufficiently less than zero, the probability of cmp(i)=1 is effectively zero. Similarly, for values of $I_x$ sufficiently greater than zero, the probability of cmp(i)=1 is effectively one. However, for values of $I_x$ that are in the range $\Delta I_x$ 407, the so-called "gray zone" of the comparator, the probability of cmp(i)=1 is non-trivial: either a "0" or a "1" may be output by the comparator, with the probability of a "1" given by the height of the curve at the value of $I_x$ being input. The width of the gray zone, as well as the shape of the probability curve within it, are determined by temperature and by various other parameters of the Josephson junctions that make up a given comparator. These same operating principles apply to unbalanced Josephson comparators, though the location of the gray zone may be shifted. Those of ordinary skill in the art will recognize other examples of Josephson comparator circuits which operate with a characteristic gray zone.

Accordingly, some embodiments of the present invention recognize the following facts, potential problems and/or potential areas for improvement with respect to the current state of the art: (i) conventional SFQ ADCs are designed to deal with signals which are much larger than the gray zone (that is, where $I_x$ is much larger than any input value in $\Delta I_x$, or $I_x>>\Delta I_x$) so that deterministic outputs are produced, at least down to the level of least significant bits (LSBs); and/or (ii) some applications, such as qubit sensing, provide very low input signals (that is, input signals that fall within the gray zone, or $I_x<<\Delta I_x$).

In addition, some embodiments of the present invention recognize: (i) that pre-amplification is one option for dealing with low-level input signals that fall into a comparator's gray zone—for example, quantum limited amplifiers (QLA), which may be employed with qubits, can be used—but that such approaches are limited by issues such as finite gain and excessive power dissipation (pre-amplifying the signal may increase its amplitude relative to the gray zone and thereby improve detection, but the amplified signal may still not exceed the boundaries of the gray zone; adding extra amplification stages is not practical in many applications due to power dissipation, especially in quantum computing, where the qubits operate at cryogenic temperatures; thus, extending sensitivity into the comparator gray zone is desirable); (ii) that information may be extracted from the probabilistic output of a comparator when its input is in the gray zone; and/or (iii) that the approaches of (i) and (ii) may be used independently of one another, but they may also be used together.

For example, return to FIG. 1 and consider circuit 500. Circuit 500 is an embodiment of the present invention for sampling baseband signals. In addition to Josephson comparator 510, described above, circuit 500 includes: collector 512; probability estimator 514; and signal estimator 516. Circuit 500 produces output 518, a measure of (input) signal $I_x$ 506, where $I_x$ 506 is a baseband signal in the gray zone of comparator 510. Circuit 500 produces output 518 by extracting probabilistic information from comparator output 508 (cmp(i)) of Josephson comparator 510. Output 518 is an estimate of the value of input signal $I_x$ 506. Alternatively, output 518 may be an estimate of whether or not the value of input signal $I_x$ 506 is above or below a fine threshold value within the comparator's gray zone.

Circuit 500 works as follows:

(i) For each pulse of clock 504, output 508 is read by collector 512. Subsampling, in which the aggregating frequency is a submultiple of the comparator's clock frequency, is also possible, but has the drawback of throwing away information, thus reducing accuracy over a given measurement period. The frequency of clock 504 is much higher (for example, 50 or 100 times higher) than the Nyquist frequency/rate of baseband input signal 506 (that is, $f_{clk} \gg f_{sig}$). A clock frequency much higher than the signal frequency permits the signal being estimated to appear effectively stationary or constant over the measurement interval. Also, the value of input signal 506 is within gray zone 407 of comparator 510 (that is, the magnitude of $I_x$ is within the range of $\delta I_x$, or $abs(I_x) < \Delta I_x$) (see FIG. 2), meaning that output 508 may not be consistent, even for an effectively constant value of $I_x$ over some sampling period.

(ii) Once collector 512 has collected some number N of readings, it passes the results to probability estimator 514. Estimator 514 estimates the probability of cmp(i)=1 using the following formula:

$$p(j) = \frac{1}{N} \sum_{i=jN+1}^{(j+1)N} cmp(i) \qquad \text{Formula 1}$$

where p(j) is the empirical probability that cmp(i)=1 for sample set j of size N output pulses. That is, estimator 514 estimates the probability of cmp(i)=1 by taking the arithmetic average of N sequential readings of output 508 from comparator 510, where each reading is either 0 or 1. In embodiment 500, $N < f_{clk}/f_{sig}$, and each time period j is non-overlapping (meaning the readings used to calculate each p(j) are not shared with any other p(j); for example, readings from clock pulses 1, 2, and 3 are used to calculate p(1), readings from clock pulses 4, 5, and 6 are used to calculate p(2), and so on). Those of ordinary skill in the art will recognize that other variations are possible, including but not necessarily limited to: (a) the use of alternative formulas for calculating p(j), (b) the use of different or varying values of N (in general, N will typically be less than the ratio of $f_{clk}$ to $f_{sig}$, but it need not be any exact equality), (c) immediate updating of the estimate for a set j as each reading is collected rather than waiting for all N readings before calculating an estimate, (d) the use of overlapping time periods j, and/or (e) the use of various time-series analysis techniques, such as exponential smoothing.

(iii) Probability estimator 514 passes its estimate of p(j) to signal estimator 516, which estimates the value of input signal $I_x$ for time period j ($I_x(j)$) using the following formula:

$$I_x(j) = \text{Prob}^{-1}(p(j)) \qquad \text{Formula 2}$$

That is, estimator 516 estimates $I_x(j)$ by computing the inverse function of p(j) using a probability curve Prob($I_x$). For any given Josephson comparator, Prob($I_x$) is a function of other properties of that comparator and the conditions under which the comparator is operating. For comparator 510, Prob($I_x$) is given by the curve shown in FIG. 2, which has been determined by empirical calibration tests (that is, it is a calibration curve). Alternatively, Prob($I_x$) may be determined by computation using theoretical models that take other relevant empirical or theoretical comparator properties and operating conditions as input for calculating Prob($I_x$). Alternatively, some embodiments, rather than estimating $I_x(j)$, only estimate whether $I_x(j)$ is above or below a fine threshold (value) lying within the gray zone of the comparator.

By repeating steps (ii) and (iii) for sequential values of j, circuit 500 extracts signal information from the probabilistic output of comparator 510 (that is, from a collection of cmp(i) data) even when input to the comparator falls within the comparator's gray zone. Operating in this manner effectively extends the sensitivity of the comparator into this range.

Figure 3:
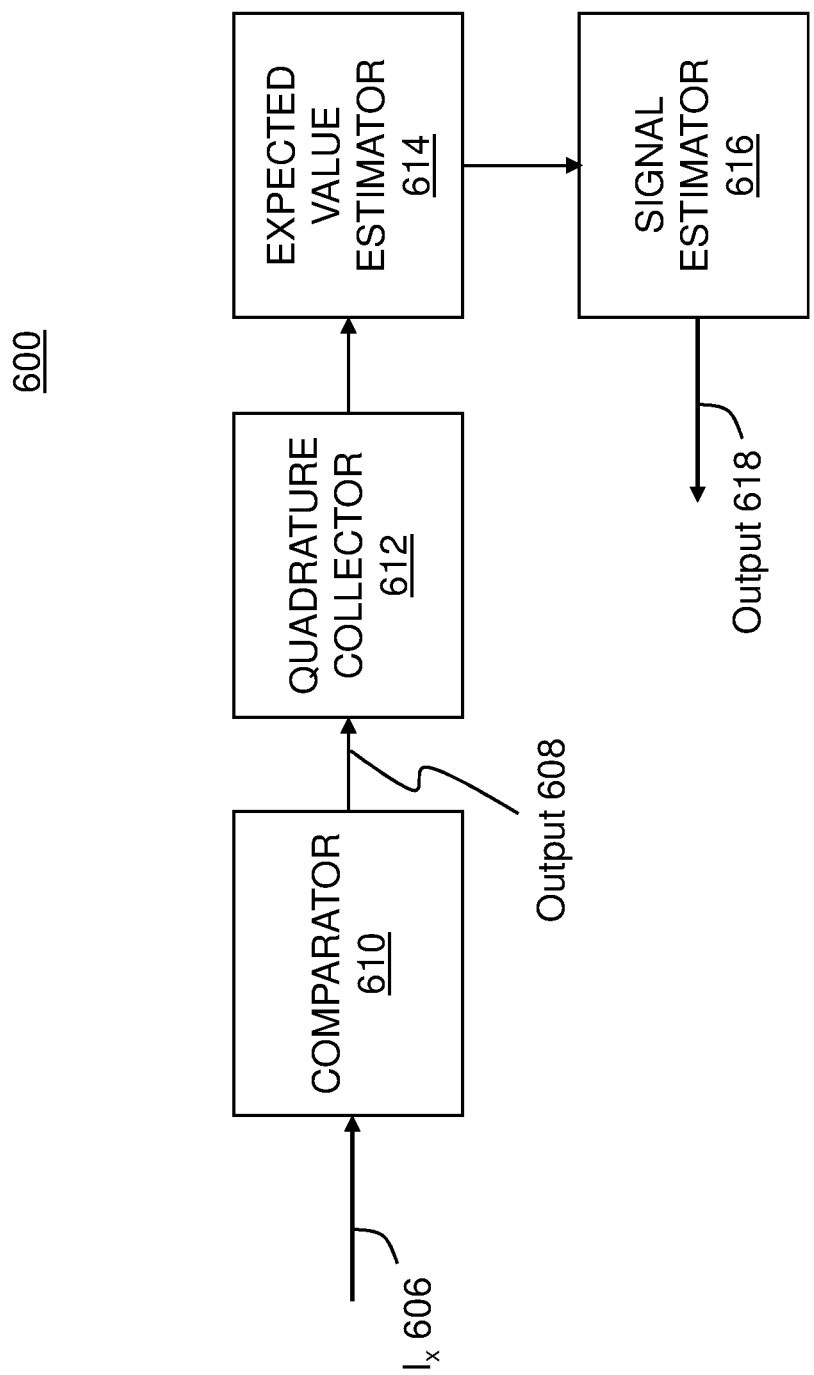
FIG. 3 is a block diagram of a second embodiment system according to the present invention.

Shown in FIG. 3 is circuit 600, illustrating an embodiment of the present invention for sampling passband signals. Circuit 600 includes: Josephson comparator 610; quadrature collector 612; expected value estimator 614; and signal estimator 616. Circuit 600 produces output 618, a measure of (input) signal $I_x$ 606, where $I_x$ 606 is a passband signal in the gray zone of comparator 610. Circuit 600 produces output 618 by extracting probabilistic information from output 608 of Josephson comparator 610. Output 618 is an estimate of the parameters (amplitude and phase) of input signal $I_x$ 606. Alternatively, output 618 may be an estimate of whether or not each parameter of input signal $I_x$ 606 is above or below a threshold value.

Circuit 600 works as follows:

(i) For each pulse of the Josephson comparator clock (not shown), output 608 is read by quadrature collector 612. The frequency of the Josephson comparator clock is much greater than the bandwidth of passband input signal 606 (that is, $f_{clk} \gg \delta f_{sig}$). Similar to the previous embodiment, a clock frequency much higher than the signal's bandwidth permits the phase and amplitude of the signal being estimated to appear effectively stationary or constant during the measurement period. The width of each of the Josephson comparator clock pulses ($\tau_{clk}$) is less than a quarter of the period of $I_x$ 606 (that is, $\tau_{clk} < 1/(4 f_{sig})$) so that the comparator makes a probabilistic decision fast enough relative to the quarter period of $I_x$ 606. As in the previous embodiment, the value of $I_x$ 606 is within the gray zone of comparator 610 (that is, the amplitude of $I_x$ is within the range of $\Delta I_x$, or $abs(I_x) < \Delta I_x$), meaning comparator output 608 may not be consistent over some sampling period even for samples taken at a consistent point in the cycle of an effectively steady signal (for example, where $I_x$ is a very high frequency sinusoidal signal with an amplitude and period that are effectively constant over the sampling period). The Josephson comparator clock is pulsed at a rate of $4 f_{sig}$, so that $I_x$ 606 is sampled four times over the course of its cycle i, producing sample outputs cmp(i, 0), cmp(i, 1), cmp(i, 2), and cmp(i, 3). As in the previous embodiment, each sample output is either a digital "0" or a digital "1".

(ii) Once quadrature collector 612 has collected a set j of samples over N periods for input signal $I_x$ 606, it passes the results to expected value estimator 614. Expected value estimator 614 estimates the in-phase probability ($p_I(j)$) of cmp(i, 0)=1 and the quadrature probability ($p_q(j)$) of cmp(i, 1)=1 for sample set j of size 4N using the following two formulas, respectively:

$$p_i(j) = \frac{1}{2} + \frac{1}{2N} \sum_{i=jN+1}^{(j+1)N} (cmp(i, 0) - cmp(i, 2)) \quad \text{Formula 3}$$

$$p_q(j) = \frac{1}{2} + \frac{1}{2N} \sum_{i=jN+1}^{(j+1)N} (cmp(i, 1) - cmp(i, 3)) \quad \text{Formula 4}$$

The values $p_i(j)$ and $p_q(j)$ are unbiased estimates of the probabilities of cmp(i, 0)=1 and cmp(i, 1)=1 because, using the in-phase and quadrature output measurements for each sample set j, they estimate the expected values of the following expressions (an in-phase expected value and a quadrature expected value, respectively), which correspond to these probabilities:

$$X_i = E\left[\frac{1}{2}(1 + cmp(i, 0) - cmp(i, 2))\right] \quad \text{Formula 3A}$$

$$X_q = E\left[\frac{1}{2}(1 + cmp(i, 1) - cmp(i, 3))\right] \quad \text{Formula 4A}$$

Note that in-phase comparisons cmp(i, 0) and cmp(i, 2) represent samples of an input sinewave which are 180 degrees apart, so their probabilities are complementary. The same is true for quadrature comparisons cmp(i, 1) and cmp(i, 3). In embodiment 600, N<$f_{clk}/\delta f_{sig}$ and each time period j is non-overlapping. Those of ordinary skill in the art will recognize that other variations are possible, including but not necessarily limited to: (a) the use of alternative formulas for calculating $p_i(j)$ and $p_q(j)$, (b) the use of different or varying values of N (in general, N will typically be less than the ratio of $f_{clk}$ to $\delta f_{sig}$, but it need not be any exact equality), (c) immediate updating of each probability estimate for a set j as each pair of readings is collected rather than waiting for all 4N readings before calculating the estimates, (d) the use of overlapping time periods j, and/or (e) the use of various time-series analysis techniques, such as exponential smoothing.

(iii) Expected value estimator 614 passes its estimates of $p_i(j)$ and $p_q(j)$ to signal estimator 616, which estimates the amplitude A(j) and phase φ(j) of input $I_x$ for time period j by solving the following set IQ of two simultaneous equations:

$$(IQ) \begin{cases} p_i(j) = Prob(A(j), \varphi(j)) \\ p_q(j) = Prob\left(A_j, \varphi(j) + \frac{\pi}{2}\right) \end{cases} \quad \text{Formula 6}$$

That is, signal estimator 616 estimates A(j) and φ(j) by finding an A(j) and a φ(j) such that the in-phase and quadrature probabilities as computed from a probability curve Prob(A, φ) for comparator 610 are equal to the empirical estimates of $p_i(j)$ and $p_q(j)$ determined in the previous step. Note that best-fit techniques may need to be used, as it is possible that no combination of A(j) and φ(j) will produce a pair $p_i(j)$ and $p_q(j)$ of computed probabilities that exactly match a given pair as determined empirically. Note also that in contrast to the previous embodiment, the probability curve in this case is a bivariate function that takes both amplitude and phase as inputs. Just as before, however, the shape of the curve may be determined (here for $I_x = A \times \sin(2\pi f_{sig}t + \phi)$) either empirically through calibration testing or theoretically through computation based on known or predicted properties of comparator 610. Some embodiments, rather than estimating A(j) and φ(j), only estimate whether the in-phase and quadrature components of input signal 606 during time period j are above or below a fine two-dimensional threshold (defined over A and φ).

By repeating steps (ii) and (iii) for sequential values of j, circuit 600 extracts signal information from the probabilistic output of comparator 610 even when input to the comparator falls within the comparator's gray zone. Operating in this manner effectively extends the sensitivity of the comparator into this range.

Note that sampling at a rate of $4f_{sig}$ is just one possibility. For example, some embodiments of the present invention use fractional frequency sampling, wherein, for instance, the input frequency ($f_{sig}$) is sampled at a rate of $(4f_{sig})/5$. The input signal in such a case is being subsampled (sampled at a rate less than the input frequency), but consecutive outputs from the SFQ comparator still represent an in-phase sample followed by a quadrature sample and so on. Although there is a penalty to pay in measurement time (since possible samples are being skipped), the same type of statistical information about the input is eventually acquired. Subsampling can be valuable because an SFQ comparator has a maximum sampling rate (beyond which it would not have good sensitivity or reliable operation). If measurements of an input signal were restricted to a rate of $4f_{sig}$, the maximum input signal frequency would be effectively limited to one quarter of the comparator's maximum sampling rate. With fractional frequency sampling (subsampling), however, this limitation is removed, and signals with frequencies exceeding the comparator's maximum sampling rate can be effectively sampled.

Figure 4:
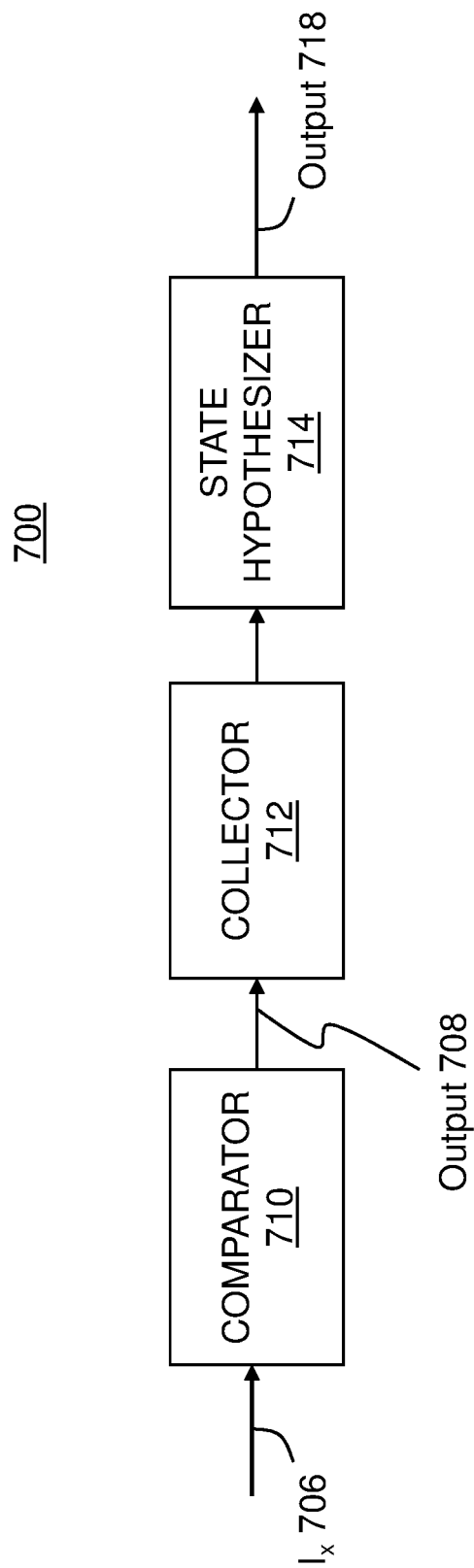
FIG. 4 is a block diagram of a third embodiment system according to the present invention.

Shown in FIG. 4 is circuit 700, illustrating an embodiment of the present invention for discriminating between two candidate stationary passband or baseband signals. Circuit 700 includes: Josephson comparator 710; collector 712; and state hypothesizer 714. Comparator 710 converts input signal $I_x$ 706 into comparator output 708. In turn, circuit 700 produces output 718, representing a decision as to which of two signals has been detected.

Figure 5:
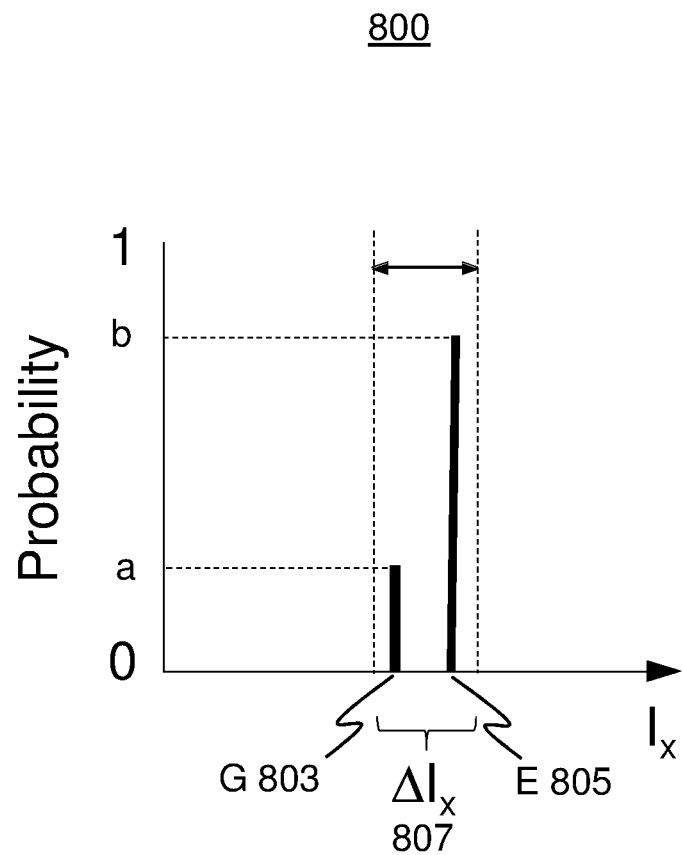
FIG. 5 is a graph showing the probability of detecting a particular output state from a Josephson comparator for each of two given qubit states in the third embodiment system according to the present invention.

This scenario is illustrated in graph 800 of FIG. 5, where the two signal levels of interest are G (ground) 803 and E (excited) 805, both 'fixed' (and, in this case, known) levels within gray zone $\Delta I_x$ 807 of comparator 710 of FIG. 4. G 803 and E 805 are signal levels corresponding to qubit states I0) and I1), respectively. Each qubit state is associated with a known probability of detecting a "1" (cmp(i)=1) at the output of the comparator due to noise associated with the comparator's gray zone. This probability is a for G 803 and b for E 805. As in previously described embodiments, such probabilities may be determined by empirical calibration and/or by theoretical computation.

Returning to FIG. 4, input signal $I_x$ 706 enters Josephson comparator 710, which, because $I_x$ is in the comparators' gray zone, produces probabilistic output 708. Collector 712 collects these respective outputs over a set of size n, as described above for previous embodiments. Because each output will be either a "0" or a "1", there will be k outputs for which cmp(i)=1, and n−k outputs for which cmp(i)=0. The results (for example, the numbers n and k) are passed to state hypothesizer 714, which uses the binomial distribution to hypothesize which state, I0> or I1>, corresponds to the measured qubit.

In addition to the probabilities a and b for cmp(i)=1, discussed above, the statistical testing performed by state hypothesizer 714 is parameterized by the number of trials (samples per set) n and an integer threshold h ∈ [0, n], where the hypothesis is that the state is "ground" (|0>, or G) if k≤h, and that the state is "excited" (|1>, or h) otherwise. The probability that this hypothesis is correct is given by the following two formulas:

Actual state    Probability hypothesis is correct $$\text{Ground }(G) \quad p(H_G \mid G) = \sum_{i=0}^{h} \frac{n!}{i!(n-i)!} a^i (1-a)^{n-i} \qquad \text{Formula 7}$$

$$\text{Excited }(E) \quad p(H_E \mid E) = \sum_{i=h+1}^{n} \frac{n!}{i!(n-i)!} b^i (1-b)^{n-i} \qquad \text{Formula 8}$$

Hypothesizer 714 chooses h such that, given a, b, and n, the hypothesizer maximizes the probability that its hypothesis is correct by minimizing the worst-case probability of failure (such as over different quantum programs having unknown frequencies of occurrence of G and E). Specifically, it chooses integer h that maximizes the following formula:

$$\min(p(H_G|G), p(H_E|E)) \qquad \text{Formula 9}$$

Alternatively, the hypothesizer may choose h based on other criteria, such as minimizing the average probability of failure (for instance, over different quantum programs having known frequencies of G and E) by maximizing the sum of each of the above conditional probabilities multiplied by the probability of its respective condition. That is, maximizing:

$$p(H_G|G)*p(G)+p(H_E|E)*p(E) \qquad \text{Formula 10}$$

Formula 10 may be particularly useful when the underlying frequencies of occurrence of G and E are known.

High rates of accuracy can be obtained with this approach. For example, using Formula 9 and given a=0.2 and b=0.7, Table 1 gives the probability the hypothesizer guesses correctly after selecting the best value of h for the given value of n:

TABLE 1

| n | h(n) | p(hypothesis is correct) |
|---|---|---|
| 10 | 4 | ≥0.952 |
| 20 | 8 | ≥0.990 |
| 30 | 13 | ≥0.997 |

Thus this approach can be used, for example, to mitigate the sensitivity limitations of a Josephson comparator for the readout of qubit state.

As will be apparent to one of ordinary skill in the art in light of the present disclosure, numerous alternative embodiments are possible. For instance, in addition to alternatives for baseband versus passband signals: (i) values of a, b, and/or n, may be manipulated to produce desired accuracy levels such as by pre-amplifying the input signal or increasing the sampling rate; (ii) different values of n may be used for different collectors or time periods; (iii) signals entering a single comparator may be compared over two time periods, or signals each entering one or two comparators may be compared over the same time period; and/or (iv) multiple threshold levels could be established to hypothesize among three or more distinct signal levels or quantum states rather than only two.

Some embodiments of the present invention may include one, or more, of the following features, characteristics and/or advantages: (i) minimize actual device noise of Josephson devices (which noise occurs through natural processes) for better comparator sensitivity; (ii) use statistics of 1s versus 0s to form an estimate of an analog input signal; (iii) use statistics of 1s versus 0s to gather information about an analog input signal; (iv) use statistics to make a binary determination of qubit state (such as |0) or |1)), with or without deriving an estimate of an analog input signal level as an intermediate step; (v) cover cases where the input signal varies during the course of the measurement such that there is no unique analog input signal level to be estimated, but analyze statistics (perhaps time-dependent) to make a binary determination of qubit state; and/or (vi) perform binary detection with or without estimating an analog input signal as an intermediate step.

Some embodiments of the present invention may include one, or more, of the following features, characteristics and/or advantages: (i) mitigate the limitations of actual physical noise of comparators inherent to the SFQ (Josephson) devices themselves; (ii) measure extremely weak signals (within the noise-induced "gray zone" of a comparator); (iii) have sensitivity limited only by the inherent internal device noise; (iv) involve superconducting technology, such as SFQ comparators formed from superconducting devices (Josephson junctions); (v) are used for the readout of qubits; (vi) detect whether a qubit is in one of two states (such as |0> or |1>); (vii) use a probabilistic digitizer to solve a binary detection problem; (viii) perform statistical sampling of signals buried in noise; (ix) average the outputs of a single comparator over time; (x) perform statistical sampling of outputs from a single comparator; and/or (xi) perform statistical sampling of comparator outputs.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that at least some blocks of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special-purpose hardware-based systems that perform the specified functions or acts or carry out combinations of special-purpose hardware and computer instructions.

Figure 6:
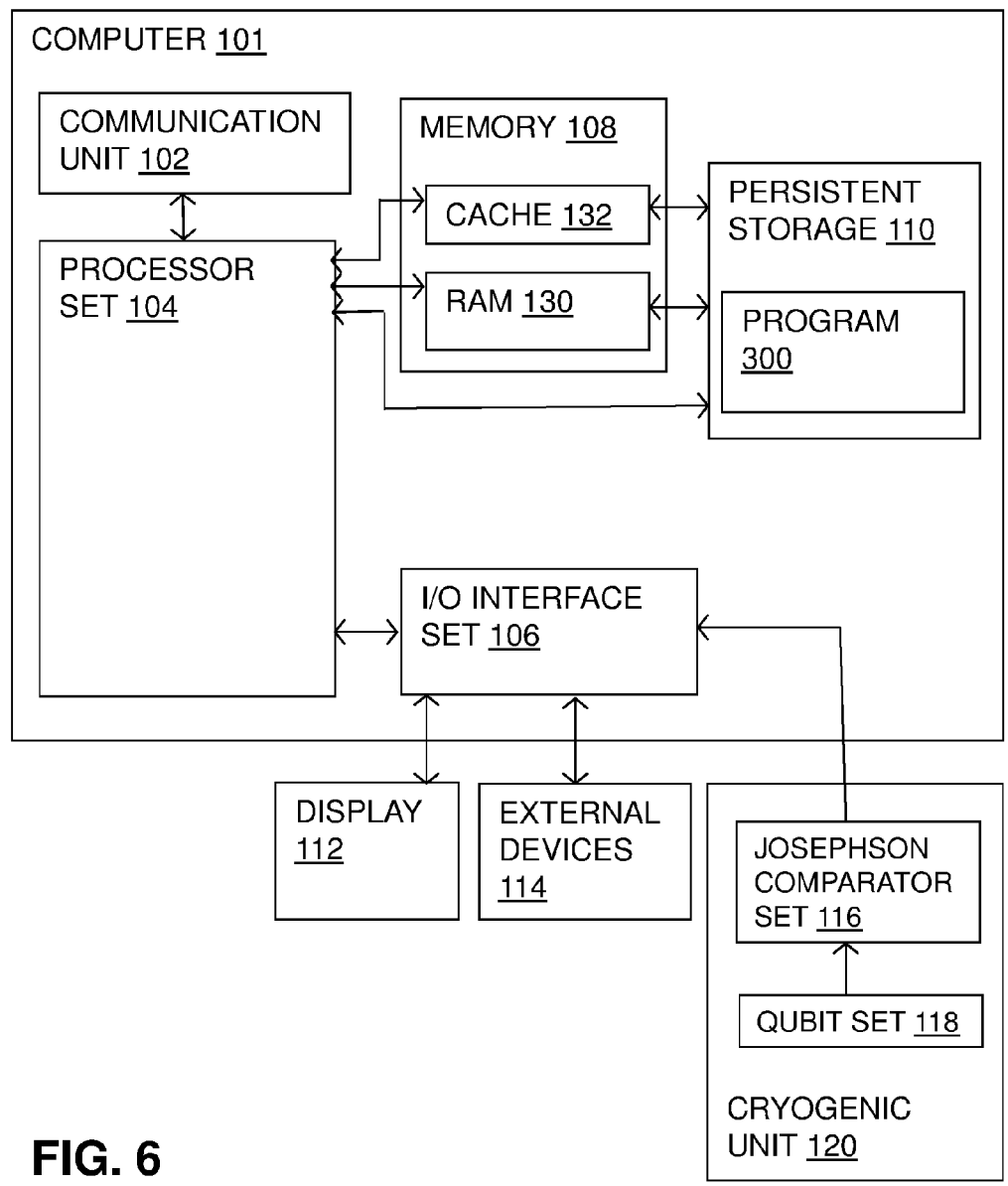
FIG. 6 is a block diagram of a fourth embodiment of a system according to the present invention.
Figure 7:
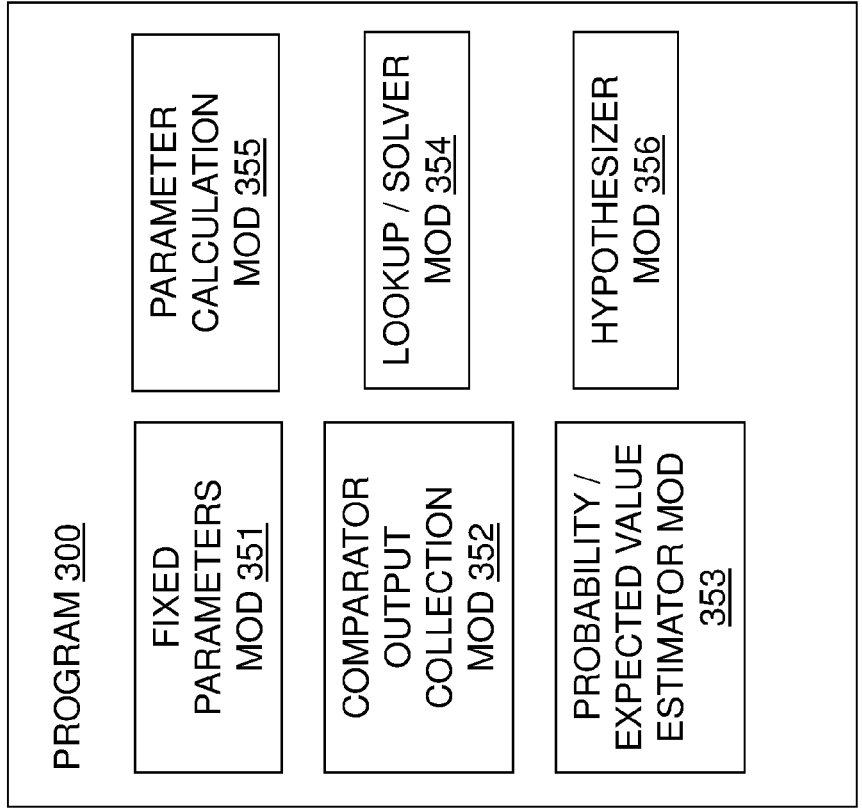
FIG. 7 is a block diagram showing a machine logic (for example, software) portion of the fourth embodiment system.

An embodiment of a possible hardware and software environment for software and/or methods according to the present invention will now be described in detail with reference to FIGS. 6-8. FIG. 6 is a functional block diagram illustrating various portions of computer system 100, including: computer 101; communication unit 102; processor set 104; input/output (I/O) interface set 106; memory device 108; persistent storage device 110; display device 112; external device set 114; Josephson comparator set 116 and qubit set 118, both located within cryogenic unit 120; random access memory (RAM) devices 130; cache memory device 132; and program 300. In some embodiments of the present invention, cryogenic unit 120 is located within computer 101, and computer 101 is a supercomputer. Several portions of computer system 100 will now be discussed in the following paragraphs.

Computer 101 may be a laptop computer, tablet computer, netbook computer, personal computer (PC), a desktop computer, a personal digital assistant (PDA), a smart phone, or any programmable electronic device. Program 300 is a collection of machine readable instructions and/or data that is used to create, manage and control certain software functions that will be discussed in detail, below.

Computer system 100 is shown as a block diagram with many arrows. These arrows (no separate reference numerals) represent a communications fabric, which provides communications between various components of computer system 100. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 108 and persistent storage 110 are computer-readable storage media. In general, memory 108 can include any suitable volatile or non-volatile computer-readable storage media. It is further noted that, now and/or in the near future: (i) external device(s) 114 may be able to supply, some or all, memory for computer 101; and/or (ii) devices external to computer 101 may be able to provide memory for computer 101.

Josephson comparator set 116 includes one or more Josephson comparators operating at cryogenic temperatures near absolute zero. Some of these comparators provide "raw" readings of the state of various qubits maintained in qubit set 118, while others form part of a single-flux-quantum analog-to-digital converter (SFQ ADC). Program 300 is a probabilistic digitizer that reads the outputs of each comparator to make a probabilistic determination of comparator input (such as analog input signal level or qubit state).

Program 300 is stored in persistent storage 110 for access and/or execution by one or more of the respective computer processors 104, usually through one or more memories of memory 108. Persistent storage 110: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 110.

Program 300 may include both machine readable and performable instructions and/or substantive data (that is, the type of data stored in a database). In this particular embodiment, persistent storage 110 includes a magnetic hard disk drive. To name some possible variations, persistent storage 110 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 110 may also be removable. For example, a removable hard drive may be used for persistent storage 110. Other examples include optical and magnetic disks, thumb drives, and smart cards that are inserted into a drive for transfer onto another computer-readable storage medium that is also part of persistent storage 110.

Communications unit 102, in these examples, provides for communications with other data processing systems or devices external to computer system 100. In these examples, communications unit 102 includes one or more network interface cards. Communications unit 102 may provide communications through the use of either or both physical and wireless communications links. Any software modules discussed herein may be downloaded to a persistent storage device (such as persistent storage device 110) through a communications unit (such as communications unit 102).

I/O interface set 106 allows for input and output of data with other devices that may be connected locally in data communication with computer 100. For example, I/O interface set 106 connects in data communication with Josephson comparator set 116. Additionally, I/O interface set 106 provides a connection to external device set 114. External device set 114 will typically include devices such as a keyboard, keypad, a touch screen, and/or some other suitable input device. External device set 114 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 110 via I/O interface set 106. I/O interface set 106 also connects in data communication with display device 112.

Display device 112 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Figure 8A:
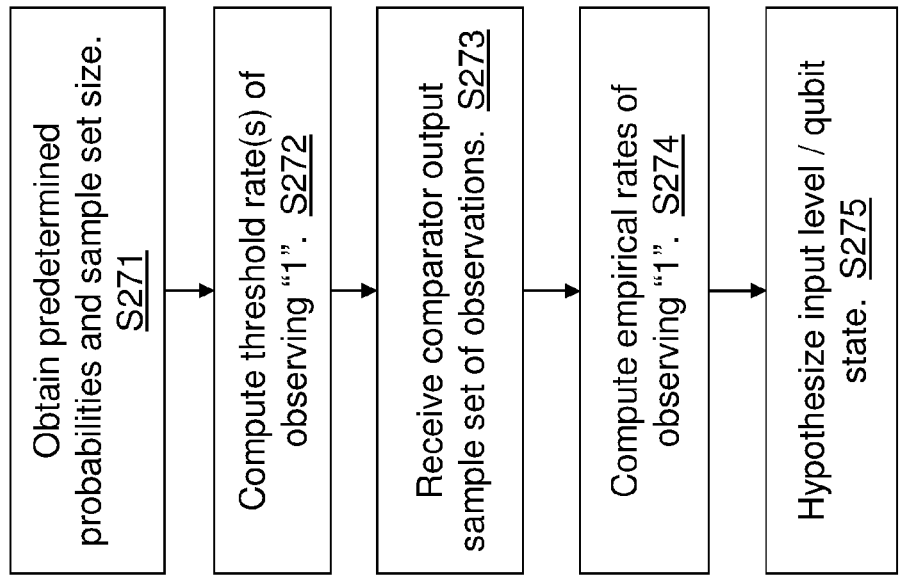
FIG. 8A is a flowchart showing a first embodiment method performed, at least in part, by the fourth embodiment system.

FIGS. 8A, 8B, and 8C show flowcharts 270, 250, and 260, respectively, each depicting a method according to the present invention. FIG. 7 shows program 300 for performing at least some of the method steps of these flowcharts. These methods and associated software will now be discussed, over the course of the following paragraphs, with extensive reference to FIGS. 7 (for the software blocks) and 8A, 8B, and 8C (for the method step blocks). The flowcharts of FIGS. 8A, 8B, and 8C describe the use of a probabilistic digitizer for distinguishing between two (or more) known states (such as for reading out the state of a qubit), estimating a baseband signal, and estimating a passband signal, respectively.

Flowchart 270 of FIG. 8A presents a method for discriminating among the two states of a qubit producing input signals that lie within the gray zone of a comparator in Josephson comparator set 116.

Processing begins at step S271, where fixed parameters module ("mod") 351 obtains static parameters that will be used throughout one or more iterations of the analysis that follows. With respect to the process of flowchart 270, fixed parameters mod 351 obtains the number N of outputs in a sample set and also the probabilities associated with a Josephson comparator in Josephson comparator set 116 (see FIG. 6) outputting a "1" as a function of the possible input signal parameter values associated with each qubit state. These predetermined probabilities are non-trivial when these parameter values are within the gray zone of the comparator. Because there are a fixed number of known, possible states (in this case, two), there is a discrete set of probabilities, one for each possible state or signal level. Although this discrete set of probabilities is considered a "fixed" or "static" input here, some embodiments may nevertheless adjust this and other parameters (such as N) dynamically over the course of their operation, for example in reaction to changing environmental conditions (such as operating temperature) of the comparator over time.

Processing proceeds to step S272, where parameter calculation mod 355 determines one or more threshold values for hypothesizing which signal level/qubit state is represented by an observed number of 1s within a given sample set, generally with the goal of maximizing the number of correct hypotheses. In this case, one threshold value is set for hypothesizing between the two possible qubit states, but multiple threshold values could be set for Josephson comparator systems in which there are three or more possible discrete input states/signal levels, at least one of which falls within the comparator's gray zone.

Processing proceeds to step S273, where comparator output collection mod 352 collects a set of N samples of comparator output, each corresponding to an attempt to measure the same qubit state.

Processing proceeds to step S274, where probability/expected value estimator mod 353 produces empirical counts of output pulses by counting the number of times output from the comparator was a "1" in the sample set using the data collected by collection mod 352.

Processing proceeds to step S275, where hypothesizer mod 356, decides, based on this empirical rate of observing is as compared against the threshold value (or values, for a system having more than two states), which qubit state is present. Note that an input signal level need not be estimated as an intermediate step, but could be estimated based on the same statistical information used to make the determination about qubit state.

The above process is then repeated over another set of samples representing a different qubit or signal state. Given appropriate sample sizes and sampling speeds, this technique can discriminate between discrete signals or qubit states with a high degree of accuracy even when one or more of the possible signal values falls within a comparator's gray zone, effectively enhancing the discriminatory capabilities of the comparator.

Flowchart 250 of FIG. 8B presents a method for estimating a baseband signal. With respect to flowchart 250 of FIG. 8B, processing for a given comparator in Josephson comparator set 116 begins at step S251, where fixed parameters module ("mod") 351 obtains static parameters that will be used throughout one or more iterations of the analysis that follows. With respect to the process of flowchart 250, fixed parameters mod 351 obtains the number N of outputs in a sample set and single-variable probability curve data describing the probability of a Josephson comparator in Josephson comparator set 116 (see FIG. 6) outputting a "1" as a function of the comparator's input signal level. This probability is non-trivial when the signal level is within the gray zone of the comparator. Although this curve is considered a "fixed" or "static" input here, some embodiments may nevertheless adjust this and other parameters (such as N) dynamically over the course of their operation, for example in reaction to changing environmental conditions (such as operating temperature) of the comparator over time.

Processing proceeds to step S252, where comparator output collection mod 352 collects a set of N samples of comparator output. These outputs are each either a "0" or a "1", and are typically sequential outputs corresponding to pulses of the comparator's clock over a relatively short period of time with respect to the input signal frequency.

Processing proceeds to step S253, where probability/expected value estimator mod 353 computes the empirical probability of any given output from the comparator being a "1" over the time period the samples were taken based on the observed frequency of is in the sample set.

Processing proceeds to step S254, where lookup/solver mod 354, computes the inverse function of this empirical probability using the probability curve from step S251 to estimate the signal level of the input to the comparator. Alternatively, the estimate may only be of whether the input signal level falls above or below a threshold.

The above process is then repeated over another set of samples. Given appropriate sample sizes and sampling speeds, this technique can, with a high degree of accuracy, resolve signal levels falling within a comparator's gray zone, effectively enhancing the sensitivity of the comparator into this range.

Flowchart 260 of FIG. 8C presents a method for estimating a passband signal. This method is similar in respects to the method just described, but uses 4 sub-samples along with appropriate modifications for using a multi-variable expected value curve (the curve represents a 2-variable function in this case).

Processing begins at step S261, where fixed parameters module ("mod") 351 obtains static parameters that will be used throughout one or more iterations of the analysis that follows. With respect to the process of flowchart 260, fixed parameters mod 351 obtains the sampling rate and/or number of observations per sub-sample and multi-variable expected value curve data describing the expected values of the output of a Josephson comparator in Josephson comparator set 116 (see FIG. 6) for both in-phase and quadrature sub-samples as a function of the amplitude and phase of the comparator's input signal. These probabilities are non-trivial when amplitude is within the gray zone of the comparator. As above, although this curve is considered a "fixed" or "static" input here, some embodiments may nevertheless adjust this and other parameters (such as N) dynamically over the course of their operation, for example in reaction to changing environmental conditions (such as operating temperature) of the comparator over time.

Processing proceeds to step S262, where comparator output collection mod 352 collects a set of N samples of comparator output. Here, however, each sample is composed of a mix of in-phase and quadrature sub-samples. These sub-samples are each either a "0" or a "1", and are typically sequential outputs corresponding to pulses of the comparator's clock over a relatively short period of time with respect to the bandwidth of the input signal.

Processing proceeds to step S263, where probability/expected value estimator mod 353 computes empirical in-phase and quadrature expected values for in-phase and quadrature output from the comparator using the in-phase and quadrature sub-samples, respectively, over the time period the samples were taken based on the observed frequency of is in the in-phase or quadrature subsets of the sample set, as appropriate.

Processing proceeds to step S264, where lookup/solver mod 354, computes the estimated amplitude and phase of the input signal to the comparator by solving a set of simultaneous equations that relate amplitude and phase to in-phase and quadrature expected values. Estimating the amplitude and phase of the input signal is possible because both in-phase and quadrature samples (which are counted and/or averaged) are obtained in the previous step. This allows two simultaneous equations to be set up and solved for these two parameters. In some situations, the solutions are based on best-fit techniques rather than being exact solutions. In some embodiments, either or both parameter estimates may only be of whether the parameter or set of parameters falls above or below a threshold level.

The above process is then repeated over another set of samples. Given appropriate sample sizes and sampling speeds, this technique can, with a high degree of accuracy, resolve signals falling within a comparator's gray zone, effectively enhancing the sensitivity of the comparator into this range.

Note that in each of the above methods, the use of counts and/or count averages are a type of aggregate measure, which is a summary measure derived from multiple inputs. Other, non-exhaustive examples of aggregate measures that may be employed by some embodiments of the present invention are the minimum or maximum of a group of values, the median or mode, the geometric average, or time-series averages such as a simple moving average, an exponential window function, or some other time-based weighting function.

Some helpful definitions now follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A method comprising:
   receiving a plurality of sample sets, with each sample set including N sequential samples;
   for each given sample set of the plurality of sample sets:
      estimating a probability p(j) of an output pulse being produced from a Josephson comparator based on the N sequential samples of the given sample set, and
      estimating an analog input current Ix(j) corresponding to the given sample set based on an inverse function of p(j) for the given sample set using a probability curve Prob($I_x$); and
   extracting a signal from output of the Josephson comparator based, at least in part upon the analog input current $I_x$(j) values respectively corresponding to the sample sets.

2. The method of claim 1 wherein the inverse function is expressed by the following equation: $I_x(j)=Prob^{-1}(p(j))$.

3. The method of claim 1 further comprising:
   performing empirical calibration tests to determine the probability curve Prob($I_x$).

4. The method of claim 1 further comprising:
   computing probability curve Prob($I_x$) based on: (i) empirical or theoretical properties of the Josephson comparator, and (ii) operating conditions of the Josephson comparator.

5. The method of claim 1 wherein, for each given sample set, N is approximately equal to an fclk value for the given sample set divided by an fsig value for the given sample set.

6. The method of claim 1 wherein sampling is done at a higher frequency than the input signal rate/frequency.

7. A computer program product comprising:
   a machine readable storage device; and
   computer code stored on the machine readable storage device, with the computer code including instructions for causing a processor(s) set to perform operations including the following:
      receiving a plurality of sample sets, with each sample set including N sequential samples,
      for each given sample set of the plurality of sample sets:
         estimating a probability p(j) of an output pulse being produced from a Josephson comparator based on the N sequential samples of the given sample set, and
         estimating an analog input current $I_x$(j) corresponding to the given sample set based on an inverse function of p(j) for the given sample set using a probability curve Prob($I_x$); and
      extracting a signal from output of the Josephson comparator based, at least in part upon the analog input current $I_x$(j) values respectively corresponding to the sample sets.

8. The computer program product of claim 7 wherein the inverse function is expressed by the following equation: $I_x(j)=Prob^{-1}(p(j))$.

9. The computer program product of claim 7 further comprising:
   performing empirical calibration tests to determine the probability curve Prob($I_x$).

10. The computer program product of claim 7 further comprising:
    computing probability curve Prob($I_x$) based on: (i) empirical or theoretical properties of the Josephson comparator, and (ii) operating conditions of the Josephson comparator.

11. The computer program product of claim 7 wherein, for each given sample set, N is approximately equal to an fclk value for the given sample set divided by an fsig value for the given sample set.

12. The computer program product of claim 7 wherein sampling is done at a higher frequency than the input signal rate/frequency.

13. A computer system comprising:
    a processor(s) set;
    a machine readable storage device; and
    computer code stored on the machine readable storage device, with the computer code including instructions for causing the processor(s) set to perform operations including the following:
       receiving a plurality of sample sets, with each sample set including N sequential samples, for each given sample set of the plurality of sample sets:
  estimating a probability p(j) of an output pulse being produced from a Josephson comparator based on the N sequential samples of the given sample set, and
  estimating an analog input current $I_x(j)$ corresponding to the given sample set based on an inverse function of p(j) for the given sample set using a probability curve $Prob(I_x)$; and
extracting a signal from output of the Josephson comparator based, at least in part upon the analog input current $I_x(j)$ values respectively corresponding to the sample sets.

14. The computer system of claim 13 wherein the inverse function is expressed by the following equation: $I_x(j)=Prob^{-1}(p(j))$.

15. The computer system of claim 13 further comprising: performing empirical calibration tests to determine the probability curve $Prob(I_x)$.

16. The computer system of claim 13 further comprising: computing probability curve $Prob(I_x)$ based on: (i) empirical or theoretical properties of the Josephson comparator, and (ii) operating conditions of the Josephson comparator.

17. The computer system of claim 13 wherein, for each given sample set, N is approximately equal to an fclk value for the given sample set divided by an fsig value for the given sample set.

18. The computer system of claim 13 wherein sampling is done at a higher frequency than the input signal rate/frequency.

* * * * *